US008080922B2

(12) United States Patent
Reiche

(10) Patent No.: US 8,080,922 B2
(45) Date of Patent: Dec. 20, 2011

(54) ULTRASONIC SENSOR HAVING A COVER INCLUDING A DAMPING ELEMENT

(75) Inventor: Martin Reiche, Weil der Stadt (DE)

(73) Assignee: Robert Bosch GmbH, Stuttgart (DE)

(*) Notice: Subject to any disclaimer, the term of this patent is extended or adjusted under 35 U.S.C. 154(b) by 477 days.

(21) Appl. No.: 12/282,194

(22) PCT Filed: Jan. 25, 2007

(86) PCT No.: PCT/EP2007/050719

§ 371 (c)(1),
(2), (4) Date: Jan. 12, 2009

(87) PCT Pub. No.: WO2007/104594

PCT Pub. Date: Sep. 20, 2007

(65) Prior Publication Data

US 2009/0301205 A1 Dec. 10, 2009

(30) Foreign Application Priority Data

Mar. 10, 2006 (DE) ......................... 10 2006 011 155

(51) Int. Cl.
*H01L 41/08* (2006.01)

(52) U.S. Cl. ................. 310/348; 310/323.21; 73/514.34

(58) Field of Classification Search .................. 310/348, 310/323.21

See application file for complete search history.

(56) References Cited

U.S. PATENT DOCUMENTS

| | | | |
|---|---|---|---|
| 5,495,766 A | 3/1996 | Kota et al. | |
| 6,374,676 B1 | 4/2002 | Arnold et al. | |
| 2008/0290758 A1* | 11/2008 | Hayashi et al. | 310/326 |

FOREIGN PATENT DOCUMENTS

| | | |
|---|---|---|
| DE | 4434692 | 3/1995 |
| DE | 29614691 | 10/1996 |
| DE | 19601570 | 7/1997 |
| DE | 19744229 | 4/1999 |
| DE | 19754891 | 7/1999 |
| DE | 10125272 | 11/2002 |
| JP | 02036700 A * | 2/1990 |
| JP | 10206528 | 8/1998 |
| JP | 2000/023293 | 1/2000 |
| JP | 2000023293 A * | 1/2000 |
| JP | 2002238095 | 8/2002 |
| WO | WO 99/30313 | 6/1999 |

OTHER PUBLICATIONS

International Search Report, PCT International Patent Application No. PCT/EP2007/050719, dated May 23, 2007.

* cited by examiner

*Primary Examiner* — Jaydi San Martin
(74) *Attorney, Agent, or Firm* — Kenyon & Kenyon LLP

(57) ABSTRACT

An ultrasonic sensor, in particular for a vehicle, including a housing, includes the following: a transducer element which is attached to the bottom of the housing for generating ultrasonic oscillations; a first damping element situated in the housing for damping oscillations of the bottom; and a cover for sealing the housing, the cover being provided with a second damping element and having continuous tapering of the cover thickness in the region of the second damping element.

11 Claims, 3 Drawing Sheets

(B-B)

(A-A)

ULTRASONIC SENSOR HAVING A COVER INCLUDING A DAMPING ELEMENT

FIELD OF THE INVENTION

The present invention relates to an ultrasonic sensor for a vehicle and a corresponding method for manufacturing the same.

BACKGROUND INFORMATION

Ultrasonic sensors are used in motor vehicles, for example as parking assistance, a so-called proximity measurement capability in a distance range of less than 30 cm being a decisive functional requirement for that purpose. They are generally made up of a housing and a transducer element situated therein. The housing is customarily molded or milled from a metallic material, for example aluminum. For purposes of corrosion protection and enameling, it is coated with a primer. An electromechanical transducer element (e.g. a piezoelectric element) is attached to the bottom of the housing, for example, glued and contacted. The housing is filled with a damping material. An injected silicone foam is one possibility for this.

For a number of reasons, these manufacturing steps are technically not trivial. In particular, the chemical processes of gluing and foaming require exact parameters and are difficult to implement in production. The same applies to contacting the transducer elements using bonds by means of thermocompression welding (TCW), for example.

Instead of filling the interior of the housing with foam, it is possible to achieve damping by placing foam pieces into the housing. The production step of filling with foam would thus be replaced by a step which is simple to manage manually. However, it is evident that as a result such sensors have less favorable attenuation characteristics than designs filled with foam, which adversely impacts the critical functional requirement for proximity measurement capability.

Measurements of the spectral components of the attenuation processes have shown that a significant component is due to resonances outside of the working frequency (48 kHz) of the ultrasonic sensor, components at 30 kHz and 70 kHz being significant in particular. These are due to tilting and crumpling movements in the housing wall. In order to dampen the housing wall vibrations, housing fillers are also used which are made of damping materials and/or additionally contain such materials.

The transducer elements are contacted, for example by attaching a terminal lead to the metalized transducer element on the upper side of the piezoelectric element, the underside of the transducer element being fastened to the bottom of the housing by a glue. The metallic housing or the metallic diaphragm constitutes the second terminal or the second electrode (cathode). The second terminal lead is then soldered to the conductive housing (made of aluminum for example), being suitably connected to it by spot-drilling of the housing wall or attached to a housing stud, which is considered to be disadvantageous with respect to the number of components and the production expense.

In another example, the contacting of the underside of the transducer is accomplished by so-called peripheral contacting. To that end, the piezoceramic disc is completely plated with silver and a D-shaped separating cut (see FIG. 2) is made in the silver plating. This results in two surfaces on the upper side which are contactable using stranded conductors, bonds or other conductors. A disadvantage in this connection is the non-homogeneous field/force distribution in the piezoceramic, since the upper surface, due to the D-cut, is only partially covered by the one (anode) contact (non-homogeneous plate capacitor). Another disadvantage is that if the underside of the transducer element is improperly glued to the bottom of the housing (as a function of the thickness of the glue and roughness of the base), the underside of the transducer element is not in contact with frame ground (GND or ground) due to the peripheral contacting and the sensor is undesirably enabled to operate as a capacitor, making it sensitive to electrical interference fields. In addition it is seen as disadvantageous that two contacts in the range of the useful oscillation are produced on the upper side of the transducer element as a result of the peripheral contacting. In addition to the influence by the contact within the meaning of a coupled oscillator, in practice the resonance frequency is reduced in proportion to the weight contribution of the contacting (for example soldering points). For this reason, thermocompression welding with low ground contribution is functionally advantageous in series production.

Japanese Patent Application No. 2002238095 A describes an ultrasonic sensor having a cover, the housing being smooth-walled on the one hand and being designed with steps on the other, which require increased production expense. The cover may be introduced into the housing offset in order to dampen specific oscillation modes, the setting of this position signifying increased expense. The cover is smooth-surfaced, it being designed to be thicker than the pot diaphragm but otherwise it has no countersinks or concavities specified in greater detail. The concept provides that the oscillating body "pot wall," which is open on one side, is supported "hard" on the upper surface, thus producing a bending wave which is suspended bilaterally (Drawing 6 and 7). The cover is glued on.

The terminals are attached to the transducer element and the housing in a manner which is not described in greater detail.

German Patent Application No. DE 296 14 691 U1 describes an ultrasonic sensor in which a felt insert is held by a cover disc above a transducer element. The transducer element is contacted via a direct connection and via a contact pin inserted into a weighting ring. The structure is complex and includes the construction of a pretensioned Teflon film.

German Patent Application No. DE 197 54 891 C1 describes an ultrasonic transducer having two damping materials over a transducer element. The housing wall is thick compared to the diaphragm, the housing wall containing a contact pin.

German Patent Application No. DE 101 25 272 A1 describes an ultrasonic sensor and its manufacturing method. Its transducer element is covered by three different layers, a cover covering three housing parts. A conductive housing part constituting the diaphragm is provided with a caulked terminal. This publication refers solely to the production of the decoupling ring between the oscillating diaphragm and housing by spray coating with silicone.

An ultrasonic transducer described in German Patent Application No. DE 197 44 229 A1 has a housing having a bead and a decoupling ring sealing the housing. In one embodiment, the decoupling ring simultaneously forms an insert as a damping material within the housing. In another embodiment, it has a cylindrical through opening which is filled with a damping material. The through opening is not specified in greater detail with respect to its geometry and function. The decoupling ring is used simultaneously as a mounting for the terminals of the transducer element, a terminal of the housing being present.

German Patent Application No. DE 44 34 692 A1 describes an example of the attachment of a piezoceramic to a metal plate of an ultrasonic sensor using a conductive glue.

SUMMARY

An example ultrasonic sensor of the present invention may have the advantage that it satisfies the requirements for the critical proximity measurement capability using a small number of components. Another advantage may be that the components are designed in such a way that the manufacture of the ultrasonic sensor is free from difficult-to-manage processes and manual production is made possible in a simple manner.

In accordance with an embodiment of the present invention, the ultrasonic sensor has a housing which is sealed by a cover which simultaneously contains a damping element making it possible to implement the terminal lead and contacting of the housing in a simple manner. An additional damping element is inserted into the housing during manufacture.

A particular advantage is that the cover has a geometric form designed in such a way as to conduct interfering wall waves into the plastic damping element inserted into it with as little reflection as possible.

According to an example embodiment of the present invention, the ultrasonic sensor, in particular for a vehicle, including a housing, includes the following: a transducer element which is attached to the bottom of the housing for generating ultrasonic oscillations; a first damping element situated in the housing for damping oscillations of the bottom; and a cover for sealing the housing, the cover being provided with a second damping element and having continuous tapering of the cover thickness in the region of the second damping element.

The housing is sealed by a cover, the contour of which is adapted to the inner wall of the housing to achieve a consistent transfer of the wall oscillation into the cover.

The cover is joined to the housing by means of a glue. For simple manufacturing, it is advantageously provided that the connection of the cover to the housing is designed to be friction-locked using a connecting element projecting from the edge of the molded section in interaction with a matching receptacle in the housing. This may be, for example a so-called clip connection. A circumferential friction-locked connection is provided between the cover and the pot wall. As a result of this, the housing oscillations on the upper side of the housing wall are not prevented by a hard mounting but are instead converted into thermal energy in the second damping element adapted as closely as possible to the mechanical impedance.

The cover is provided with a through opening in which the damping element is situated, the opening having a continuous edge of its inner wall. The continuously running edge makes it possible for the wall oscillations transferred into the cover to migrate in adapted form into this damping element where they are converted into thermal energy and decay by damping.

The cover is provided with leadthroughs for terminal leads of the transducer element. Furthermore, the cover has at least one contacting device for an electrically conductive connection between a terminal element and the housing. On the one hand, this makes it advantageously possible to use a converter element which is metalized on only one side, the lower electrode being formed by the conductive housing. On the other hand, there is the advantage that when the cover is attached to the housing, the housing is contacted at the same time, thus eliminating additional work on the housing and simplifying the manufacturing.

Preferably, the contacting device is designed for this purpose as an insulation displacement construction or as a contact spring. In a preferred manner, the insulation displacement construction is integrated in the cover.

Alternatively, the contacting device may be a conductive glue, the advantage being that the conductive glue simultaneously forms the friction-locked connection of the cover to the housing.

Another specific embodiment provides that the external diameter of the cover is designed to be somewhat larger than the external diameter of the housing for mounting a decoupling ring. This increases the possibility of using the sensor for other applications. The need for a mounting bead or groove on the metallic housing wall is thus eliminated. Another advantage is that the mechanical impedance of the wall is not changed.

Thus, the housing advantageously has no bead or groove. This avoids a change of the mechanical impedance of the housing wall and accordingly a reflection point for oscillations in the housing wall.

To avoid a harmonic component of approximately 54 kHz, it is provided that the first damping element is designed as an open-pore foam insertion component which can be inserted into the housing. It is possible to do this manually in a simple manner before the housing is sealed.

An example method according to the present invention for manufacturing an ultrasonic sensor as described above includes the following method steps:

(V1) manufacturing of the cover and introduction of the second damping element into the opening of the cover;

(V2) machining the partly equipped housing; and (V3) manufacture of the ultrasonic sensor by sealing the housing the cover.

It is preferred that while machining the partly equipped housing, the terminal leads are soldered onto the corresponding terminal points and the first damping element is inserted into the housing thereafter.

The following advantages may be obtained.

At its working frequency of 48 kHz, the ultrasonic sensor continues to have a low resistance and thus remains efficient. This is the result of the controlled damping of the diaphragm using insertion part 1. It may be actuated at lower transmission voltages and has higher generator voltages in the microphone range. The former is equivalent to a reduced risk of depolarization of the piezoceramic, reduced overmodulation of a transformer into non-linearity or the possibility of a smaller transformer transformation ratio and consequently the use of a smaller driver stage.

The difficult-to-manage reaction equilibrium between propellant expansion and adhesion of a silicone in the foaming process of the same is replaced by a simple mechanical joining process of the cover.

The cover itself may be prefabricated as an intermediate product including its introduced damping material independent of cycle times of the sensor production; buffering effects of a single-strand production line may be avoided. This damping material may be specifically designed for the wall oscillations.

The elimination of the bead means advantages in the primary manufacturing of the housing by extrusion.

The high transmission effect and improved signal-to-noise ratios for reception make the sensor well suited for implementing longer ranges for expanded functions such as parking space measurement, blind spot monitoring, LSF [Low-Speed Following], etc.

The proximity measurement capability of the sensor according to the present invention is improved in an unfoamed housing from approximately 28 cm . . . 30 cm to approximately 22 cm . . . 23 cm on the plausibilized binary signal.

Additional advantages and features of the present invention may be derived from the description and figures below.

BRIEF DESCRIPTION OF THE DRAWINGS

The present invention is explained in greater detail below with reference to the exemplary embodiment shown in the figures.

DETAILED DESCRIPTION OF EXAMPLE EMBODIMENTS

Identical or similar components having identical or similar functions are provided with identical reference symbols in the figures.

Figure 1:
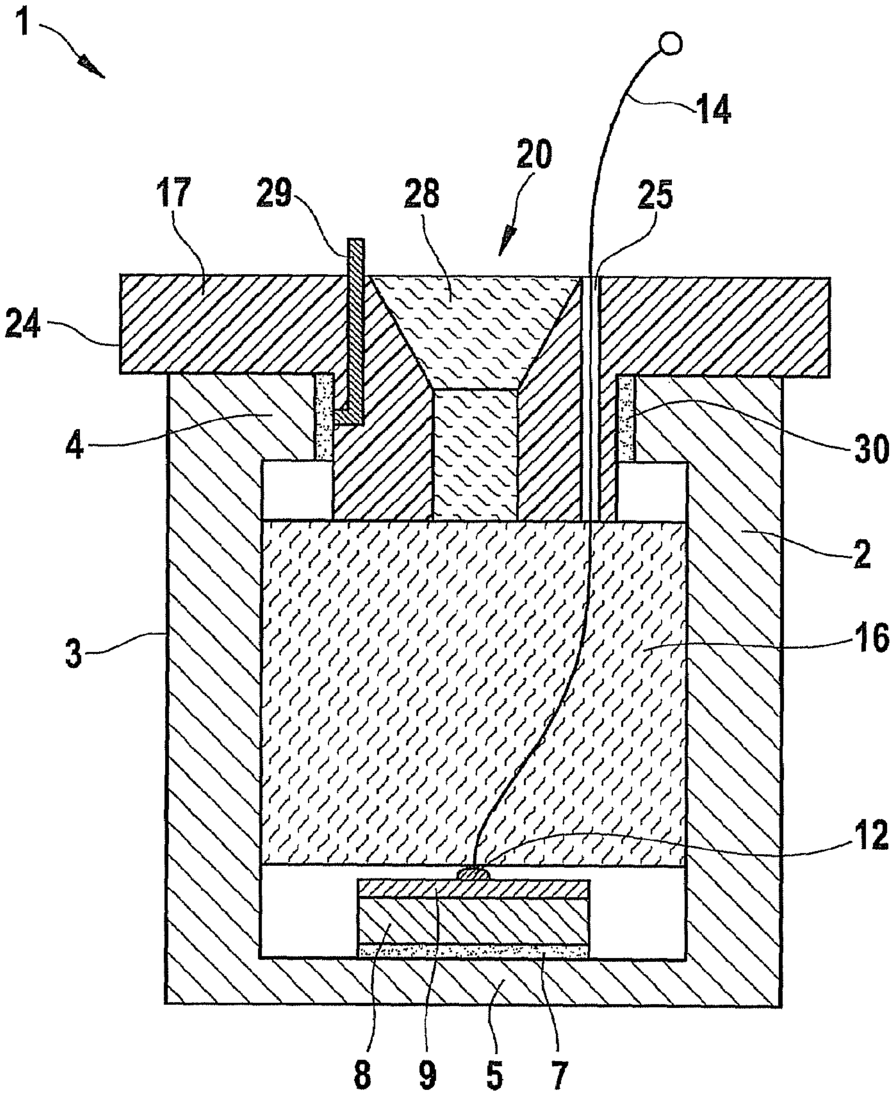
FIG. 1 shows a schematic sectional representation of an exemplary ultrasonic sensor according to the present invention.

A sensor 1 according to the present invention is shown in FIG. 1 as an exemplary embodiment in a sectional representation. A housing 2 has a bottom 5 as a diaphragm.

Furthermore, at its upper side, housing 2 has an edge 4 having an opening with a contour 6 (see FIG. 2), into which a cover 17 is inserted. Housing 2 is preferably an extruded aluminum part.

In the interior of housing 2, a transducer element 8 is fastened to the bottom of housing 2 by means of a connecting element 7, in this case a glue. only one side of transducer element 8 has a first plating 9 of a suitable metal, for example silver. Plating 9 is connected to a first lead 14 via a soldered joint in a first terminal point 12. Transducer elements 8 having a second coating 10 on their underside may also be used, connecting element 7 then being designed in the form of an adhesive glue.

A first damping element 16 is inserted above transducer element 8 for damping the diaphragm's oscillation. First lead 14 is routed either around first damping element 16 or in a bulge or recess of damping element 16.

Housing 2 is contacted to the terminal of the underside of transducer element 8 by a contacting device 30 which is located on a molded section 23 on the underside of cover 17. This contacting device 30 may, for example, be designed as an insulation displacement construction, spring construction or in a simple manner as a conductive glue. The conductive glue may also simultaneously form a friction-locked connection of cover 17 to housing 2. Within cover 17, contacting device 30 is connected to a terminal element 29 which in this example projects, for example, above cover 17, to which a second lead may be connected by soldering, for example.

Cover 17 seals housing 2 in that its molded section 23 is inserted into contour 6 of the housing opening with a positive connection. A friction-locked connection may be produced by means of a glue and/or a connecting device. Such a connecting device may be, for example, an element projecting from the edge of molded section 23, the element, for example, a clip connection, suitably interlocking with housing 2. Housing 2 may have suitable grooves (not shown).

An opening 20 is introduced in cover 17, the opening being filled with a second damping element 28, for example a plastoelastic material. This opening 20 is described in even greater detail below.

For manufacturing sensor 1, cover 17 and housing 2 are prefabricated, either together on one line or also separately. The prefabrication operations may be performed independently of one another. Sensor 1 is manufactured; the first lead is soldered onto transducer element 8 glued into housing 2. First damping element 16 is then inserted. First lead 14 may be already fed through in cover 17 or also be glued in. The housing is then sealed using cover 17, the connection possibilities enumerated above being used. Terminal element 29 may either have been connected earlier or it may be connected now.

Figure 2:
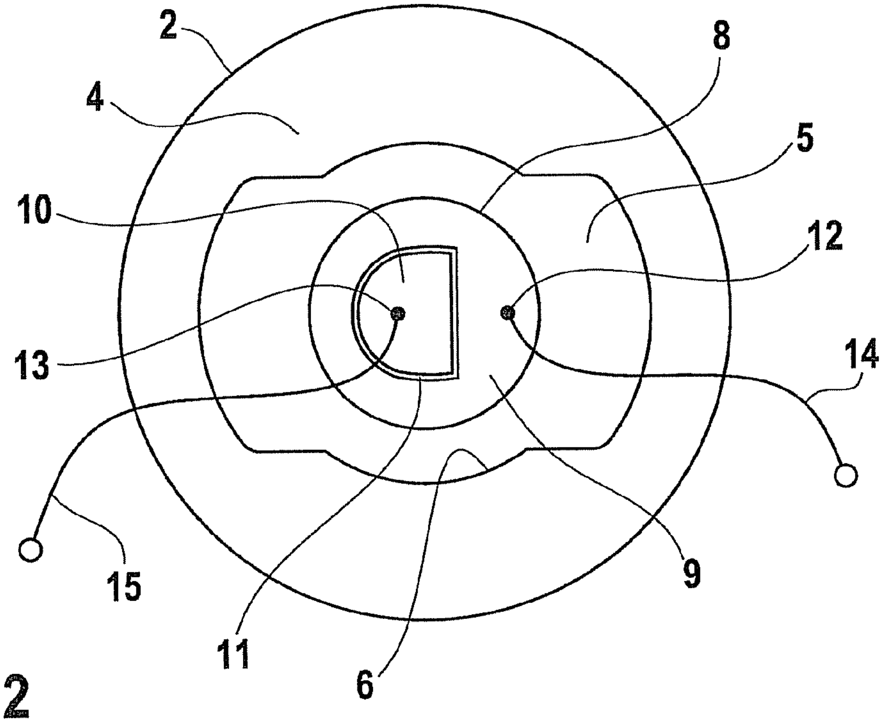
FIG. 2 shows a top view of the housing without a cover of a sensor having a peripherally contacted transducer element.

Sensor 1 may also be equipped with a peripherally contacted transducer element 8, which is shown only schematically in a top view of an opened housing 2 in FIG. 2. Transducer element 8 is provided with a metallic coating 8, which has a D-shaped separating joint 11 on its upper side. This forms two connection areas, each of which is contacted using a lead 14, in terminal points 12, 13.

Figure 3:
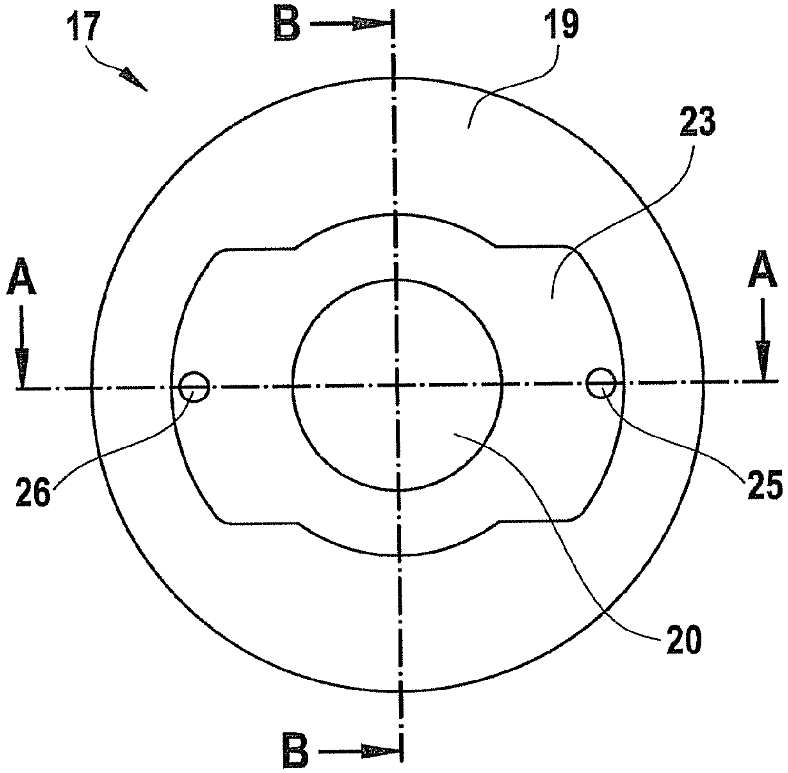
FIG. 3 shows a top view of the underside of the cover of the sensor according to FIG. 1.

Cover 17 is described in greater detail below. FIG. 3 shows the view of its underside 19 having a molded section 23 which extends on both sides in one direction from the center of cover 17 in the form of a rectangle having rounded corners. Its shape is adapted to contour 6 of housing 2 (see FIG. 2) and may also have other designs. Feedthroughs 25, 26 for leads 14, 15 of transducer element 8 are provided in the area of molded section 23, thus ensuring a wider guidance. The leads may also already be injected into cover 17 which, for example, is made of a suitable plastic.

Figure 4:
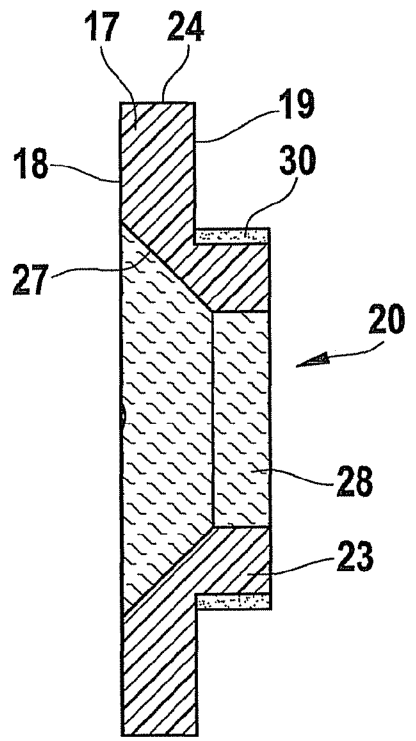
FIG. 4 shows a sectional representation of the cover according to FIG. 3 along line B-B.
Figure 5:
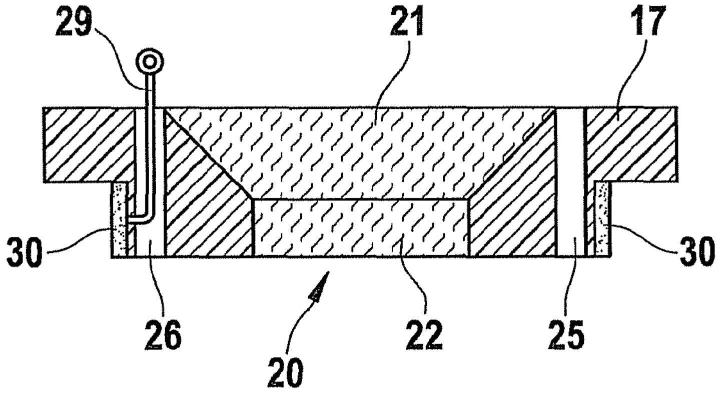
FIG. 5 shows a sectional representation of the cover according to FIG. 3 along line A-A.

Opening 20 penetrates the cover as shown in FIG. 4 in a sectional representation along line B-B and in FIG. 5 along line A-A according to FIG. 3. Opening 20 has a first and second opening section 21 and 22, the first opening section being cone-shaped. Inner walls 27 of opening sections 21, 22 have a continuous edge and accordingly a continuous tapering of the cover thickness for the advantageous introduction of oscillations into second damping element 28, which is introduced in opening 20.

Contacting device 30 is situated on the outside of molded section 23. It may also be attached to underside 19 of cover 17. In this embodiment, upper side 18 of cover 17 is smooth. However, it may also have other suitable shapes.

The present invention is not limited to the exemplary embodiments described above but instead may be modified in various ways.

It is, for example, possible for contacting device 30 to be a combination of an insulation displacement connection, contact spring and adhesive glue.

In addition, other shapes of opening 20 are possible.

Second damping element 28 may also be produced together with cover 20 in one two-component injection molding operation.

It is also possible that cover 17 and housing 2 may be joined by a threaded connection having, for example, a quarter turn, it being possible for molded section 23 to have a suitable shape including a built-up edge.

What is claimed is:

1. An ultrasonic sensor for a vehicle, comprising:

a housing;

a transducer element attached to a bottom of the housing for generating ultrasonic oscillations;

a first damping element situated in the housing for damping oscillations of the bottom; and a cover for sealing the housing, the cover being provided with a second damping element situated in an opening of the cover, and having continuous tapering of a cover thickness in a region of the second damping element.

2. The ultrasonic sensor as recited in claim 1, wherein an underside of the cover has a molded section for a positive connection with a matching contour of the housing.

3. The ultrasonic sensor as recited in claim 2, wherein a connection of the cover to the housing at least one of: i) is designed to be friction-locked using a connecting element projecting from an edge of the molded section in interaction with a matching receptacle in the housing, and ii) is via a glue.

4. The ultrasonic sensor as recited in claim 1, wherein the opening has a continuously running edge of its inner wall.

5. The ultrasonic sensor as recited in claim 1, wherein the cover has at least one leadthrough for terminal leads of the transducer element.

6. The ultrasonic sensor as recited in claim 1, wherein the cover has at least one contacting device for an electrically conductive connection between a terminal element and the housing.

7. The ultrasonic sensor as recited in claim 6, wherein the contacting device is designed as an insulation displacement construction or as a contact spring.

8. The ultrasonic sensor as recited in claim 6, wherein the contacting device is a conductive glue.

9. The ultrasonic sensor as recited in claim 1, wherein an external diameter of the cover is designed to be larger than an external diameter of the housing for mounting a decoupling ring.

10. The ultrasonic sensor as recited in claim 1, wherein the first damping element is an open-pore foam insertion component which can be inserted into the housing.

11. The ultrasonic sensor as recited in claim 1, wherein the housing has a smooth-walled outer wall.

* * * * *